(12) United States Patent
Shen

(10) Patent No.: US 8,390,381 B2
(45) Date of Patent: Mar. 5, 2013

(54) TWO STAGE DOHERTY AMPLIFIER

(75) Inventor: Yilong Shen, Nijmegen (NL)

(73) Assignee: NXP B.V., Eindhoven (NL)

( * ) Notice: Subject to any disclaimer, the term of this patent is extended or adjusted under 35 U.S.C. 154(b) by 15 days.

(21) Appl. No.: 13/150,916

(22) Filed: Jun. 1, 2011

(65) Prior Publication Data
US 2011/0298544 A1 Dec. 8, 2011

(30) Foreign Application Priority Data

Jun. 2, 2010 (EP) .................................. 10164688

(51) Int. Cl.
*H03F 3/68* (2006.01)
(52) U.S. Cl. ...................... 330/295; 330/124 R; 330/136
(58) Field of Classification Search .................. 330/295, 330/124 R, 84, 286, 136, 310, 302
See application file for complete search history.

(56) References Cited

U.S. PATENT DOCUMENTS

| | | | |
|---|---|---|---|
| 4,904,966 A | 2/1990 | Rubin | |
| 4,928,078 A | 5/1990 | Khandavalli | |
| 6,356,149 B1 | 3/2002 | Stengel et al. | |
| 6,737,922 B2 | 5/2004 | Pengelly et al. | |
| 6,853,245 B2 | 2/2005 | Kim et al. | |
| 7,078,976 B2 | 7/2006 | Blednov | |
| 7,078,978 B2 | 7/2006 | Wakii | |
| 7,262,656 B2 | 8/2007 | Shiikuma | |
| 7,427,895 B1 | 9/2008 | Okubo et al. | |
| 7,453,320 B2 | 11/2008 | Shiikuma | |
| 7,646,248 B2 * | 1/2010 | Yang et al. | 330/295 |
| 8,183,929 B2 * | 5/2012 | Grondahl | 330/295 |
| 2003/0141933 A1 | 7/2003 | Pengelly | |
| 2004/0113698 A1 | 6/2004 | Kim et al. | |
| 2007/0103237 A1 | 5/2007 | Shiikuma | |
| 2007/0298736 A1 | 12/2007 | Fujioka et al. | |

(Continued)

FOREIGN PATENT DOCUMENTS

| | | |
|---|---|---|
| EP | 1 394 932 A1 | 3/2004 |
| EP | 1394932 A1 | 3/2004 |

(Continued)

OTHER PUBLICATIONS

Yang, Y. "A Microwave Doherty Amplifier Employing Envelope Tracking Technique for High Efficiency and Linearity", IEEE Mic. and Wireless Components Ltrs, vol. 13, No. 9, pp. 370-372 (Sep. 1, 2003).

(Continued)

*Primary Examiner* — Hieu Nguyen

(57) ABSTRACT

The invention refers to a Doherty power amplifier comprising a first power amplifier (Main PA) adapted to receive an input signal and adapted to provide a first output signal which is phase shifted with respect to the input signal. The amplifier further comprises a second power amplifier (Peak PA), adapted to receive a phase shifted input signal and adapted to provide a second output signal. The power amplifier is characterized in that at least one of the first or the second power amplifiers comprises a first driver power amplifier (T1) comprising a first gate input and a first drain output. The first driver power amplifier (T1) is coupled to a first output power amplifier (T2) comprising a second gate input and a second drain output. The first gate input and the second gate input are adapted to receive a control signal, the control signal being obtained after an envelope detection provided by an envelope detector coupled to the input signal.

9 Claims, 4 Drawing Sheets

U.S. PATENT DOCUMENTS

| 2009/0102553 A1 | 4/2009 | Yang |
| 2010/0188147 A1 | 7/2010 | Blednov et al. |

FOREIGN PATENT DOCUMENTS

| EP | 1677414 A1 | 7/2006 |
| EP | 1 793 490 A1 | 6/2007 |
| WO | 2004088837 A2 | 10/2004 |
| WO | 2004100215 A2 | 11/2004 |
| WO | 2005031967 A1 | 4/2005 |
| WO | 2006102466 A2 | 9/2006 |
| WO | 2006123289 A2 | 11/2006 |

OTHER PUBLICATIONS

Cha, J. et al. "An Adaptive Bias Controlled Power Amplifier with a Load Modulated Combining Scheme for High Efficiency and Linearity", IEEE MIT-S Digest, vol. 1, pp. 81-84 (Jun. 4, 2003).

Extended European Search Report for European Patent Appln. 10164688.3 (Sep. 24, 2010).

Wood, Simon M., et al; "A High Power, High Efficiency UMTS Amplifier Using a Novel Doherty Configuration"; Radio and Wireless Conference 2003; IEEE, Piscataway, NJ, US; Aug. 10, 2003; pp. 329-332.

Shrirattana, N., et al; "Analysis and Design of High Efficiency Multistage Doherty Power Amplifier for Wireless Communications"; IEEE Transactions on Microwave Theory and Techniques; vol. 53, No. 3; Mar. 2005.

Kim, I., et al; "Highly Linear Three-Way Doherty Amplifier With Uneven Power Drive for Repeater System"; IEEE Microwave and Wireless Components Letters; vol. 16, No. 4; Apr. 2006.

Blednov, Igor, et al; "High-Power LDMOS Integrated Doherty Amplifier for WCDMA"; IEEE Radio Frequency Integrated Circuits (RFIC) Symposium; Jun. 2006.

* cited by examiner

TWO STAGE DOHERTY AMPLIFIER

CROSS-REFERENCE TO RELATED APPLICATIONS

This application claims the priority under 35 U.S.C. §119 of European patent application no. 10164688.3, filed on Jun. 2, 2010, the contents of which are incorporated by reference herein.

FIELD OF THE INVENTION

The invention relates to a two stage Doherty Amplifier comprising a first power amplifier adapted to receive an input signal and adapted to provide a first output signal which is phase shifted with respect to the input signal, the amplifier further comprising a second power amplifier, for receiving a phase shifted input signal and adapted to provide a second output signal.

BACKGROUND OF THE INVENTION

Doherty amplifiers are widely used in high frequency power amplifiers. A typical Doherty amplifier is shown in FIG. 1. It comprises a main power amplifier (PA) and a peak PA. The power amplifiers are implemented using different technologies as LDMOS, HEMT, etc. An input signal applied at an input terminal of the amplifier is divided into two components. A first component is applied to the main PA and a second component is applied to a phase shifter $Z_{01}$ which is adapted to phase shift the input signal with 90°. The phase shifted second component is inputted to the peak PA. The main PA delivers an amplified version of the first component which is applied to an input of second phase shifter $Z_{01}$ which is substantial identical to the first phase shifter. A phase shifted version of the amplified version of the first component is combined with a signal delivered by the peak PA. The combined signal is then applied to the input of a third phase shifter $Z_{02}$, which is phase shifting the combined signal with 90°. The phase shifted signal is then applied to an output terminal. Particularly, the peak PA and the main PA are each transistors having a gate input.

Throughout this description we shall keep this terminology even if the amplifiers are implemented using more than one transistor. In this case a gate input refers to the gate of a transistor included in the PA and which receives a control signal. At the same time, a drain input refers to a drain terminal of a transistor included in the PA and which is used for supplying the transistor. It is understood that in specific cases the gate input could coincide with the input of the PA.

The Doherty amplifier may be implemented using two amplifying stages either for the peak PA or for the main PA or for both. An example of such a two stage amplifier is shown in FIG. 2. It comprises a first driver transistor T1 coupled to a power transistor T2 via an inter-stage matching circuit 20. The first driver transistor T1 receives an input signal via an input matching circuit 10 which is used for adapting the input impedance of the driver transistor with an impedance of a generator which generates the input signal. An output signal generated by the power transistor T2 is outputted to a receiver (not shown in the figure) via an output matching circuit 30 which adapts an output impedance of the power transistor T2 with an input impedance of the receiver.

SUMMARY OF THE INVENTION

It is a need to improve the efficiency, while keeping a good linearity of the amplifier.

It is therefore an object of the invention to improve the performance of a two stage Doherty amplifier. This object is achieved in a Doherty power amplifier as described in the first paragraph wherein, at least one of the first or the second power amplifiers comprises
- a first driver power amplifier comprising a first gate input and a first drain output;
- the first driver power amplifier being coupled to a first output power amplifier comprising a second gate input and a second drain output;
- the first gate input and the second gate input being adapted to receive a control signal, the control signal being obtained after an envelope detection provided by an envelope detector coupled to the input signal.

These features determine a lower power consumption for the amplifier as the control is applied on the gate inputs of the amplifier. Furthermore, the gate input controls allow for a better control of the linearity and power efficiency of the amplifier.

The invention is defined by the independent claims. Dependent claims define advantageous embodiments.

In an embodiment of the invention, the Doherty amplifier further comprises a control logic circuit, the control logic circuit comprising
- a first difference amplifier adapted to receive an output signal generated by the envelope detector and a first reference signal and generating a first difference signal;
- a first limiter adapted to receive the first difference signal and generating a first limiter output signal;
- a second limiter adapted to receive the output signal generated by the envelope detector and to generate a second limiter output signal;
- a summing amplifier adapted to receive the second limiter output signal and the first difference signal, the summing amplifier generating a summing output signal, wherein the first limiter output signal is adapted to control the first gate and the summing output signal is adapted to control the second gate.

In a further embodiment of the invention the second control gate is receiving the summing output signal via an amplifier.

Preferably, the summing amplifier comprises an adder adapted to receive the second limiter output signal and the first difference signal and to generate an adder output signal, the summing amplifier further comprising a second difference amplifier for receiving the adder output signal and a second reference signal and generating the summing output signal.

Advantageously, the second reference signal is simply half of the first reference signal.

In another embodiment, the first power amplifier and the second power amplifier comprise
- a first driver power amplifier including a first gate input and a first drain output;
- the first driver power amplifier being coupled to a first output power amplifier comprising a second gate input and a second drain output;
- the first gate input and the second gate input being adapted to receive a control signal, the control signal being obtained after an envelope detection provided by an envelope detector coupled to the input signal.

Preferably, a signal generated by either the first power amplifier or the second power amplifier or both is inputted in a circuit for trapping a second harmonic and third harmonic of the signal. This improves the purity of the signal generated by the power amplifier and further improves the linearity and efficiency of the amplifier.

The applications also refers to a method of operating a Doherty power amplifier comprising steps of:
  receiving an input signal by a first power amplifier and providing a first output signal which is phase shifted with respect to the input signal;
  receiving a phase shifted input signal by a second power amplifier, and providing a second output signal;
characterized in that the method further comprises steps of
  receiving a control signal representing a signal that would be obtained by an envelope detection of the input signal;
  applying the control signal to a circuit comprising a first driver power amplifier comprising a first gate input and a first drain output, the first driver power amplifier being coupled to a first output power amplifier (T2) comprising a second gate input and a second drain output, the first gate input and the second gate input being adapted to receive a control signal, the control signal being obtained after an envelope detection provided by an envelope detector coupled to the input signal.

In a preferred embodiment the method of operating a Doherty power amplifier further comprises the step of envelope detection of the input signal using an envelope detector, for obtaining the control signal.

It should be pointed out that the envelope detection may not be part of the claimed circuit and the information related to the envelope of the signal could be generated elsewhere.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
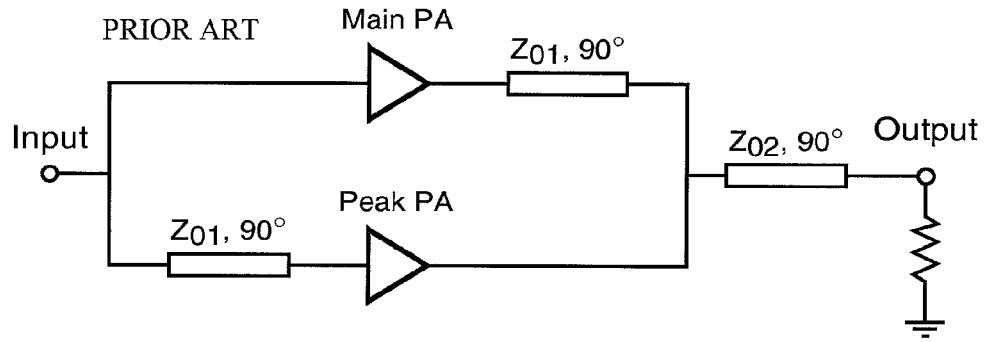
FIG. 1 depicts a one stage Doherty amplifier.
Figure 2:
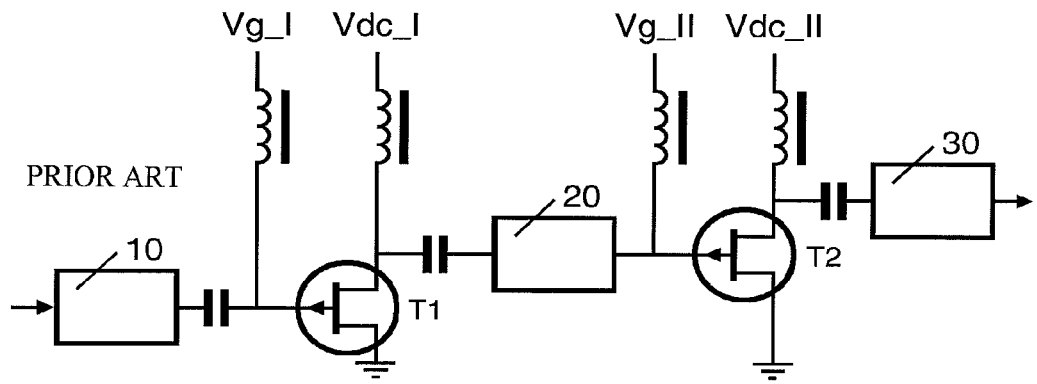
FIG. 2 depicts a common two-stage amplifier.
Figure 3:
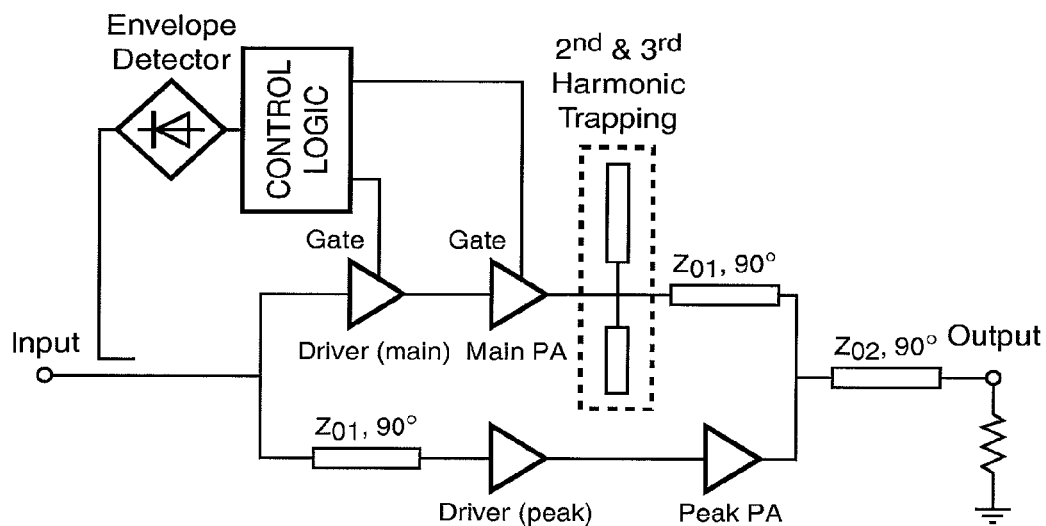
FIG. 3 depicts a two stage Doherty amplifier, according to the invention.

FIG. 3 depicts a two stage Doherty amplifier, according to the invention. The Doherty power amplifier comprises a first power amplifier Main PA adapted to receive an input signal. The first power amplifier is adapted to provide a first output signal which is phase shifted with respect the input signal. The amplifier further comprises a second power amplifier, adapted to receive a phase shifted input signal and providing a second output signal. The first power amplifier comprises a first driver power amplifier Driver (main) comprising a first gate input and a first drain output. The first driver power amplifier Driver (main) is coupled to a first output power amplifier Main PA comprising a second gate input and a second drain output. The first gate input and the second gate input each receives a control signal. The control signal is obtained after an envelope detection provided by an envelope detector coupled to the input signal.

It should be mentioned here that in FIG. 3 it is shown, for illustrative purposes, that only the Driver (main) and the Main PA are controlled by the signal generated by the envelope detector. However, it is possible that Peak PA and its driver Driver (peak) can be controlled by a control signal obtained after the envelope detection provided by an envelope detector coupled to the input signal. Even more, it is also possible that both Main PA and its driver Driver (main) and the Peak PA and its driver Driver (peak) are controlled by the control signal obtained after an envelope detection provided by an envelope detector coupled to the input signal. These features further improve the linearity and the efficiency of the amplifier.

A signal generated by either the Main PA or the Peak PA can comprise harmonics i.e. signals with a frequency which is a multiple of a main frequency of the signal generated by the amplifier. These harmonics are determined by the nonlinearities of the components used in the amplifier. As it is well-known, the second and the third harmonics i.e. the signal having the double and the three times frequency of the signal generated by the power amplifier, have the highest amplitudes. These harmonics determines at least a worst linearity for the amplifier. Hence the Doherty power amplifier comprises a circuit for trapping the second harmonic and/or third harmonic of the signal. It is understood that the term "trapping" means that the respective circuit is adapted to reduce the amplitude of the respective harmonics. An example of the trapping circuit is a notch filter, as it is known from the art.

Figure 4:
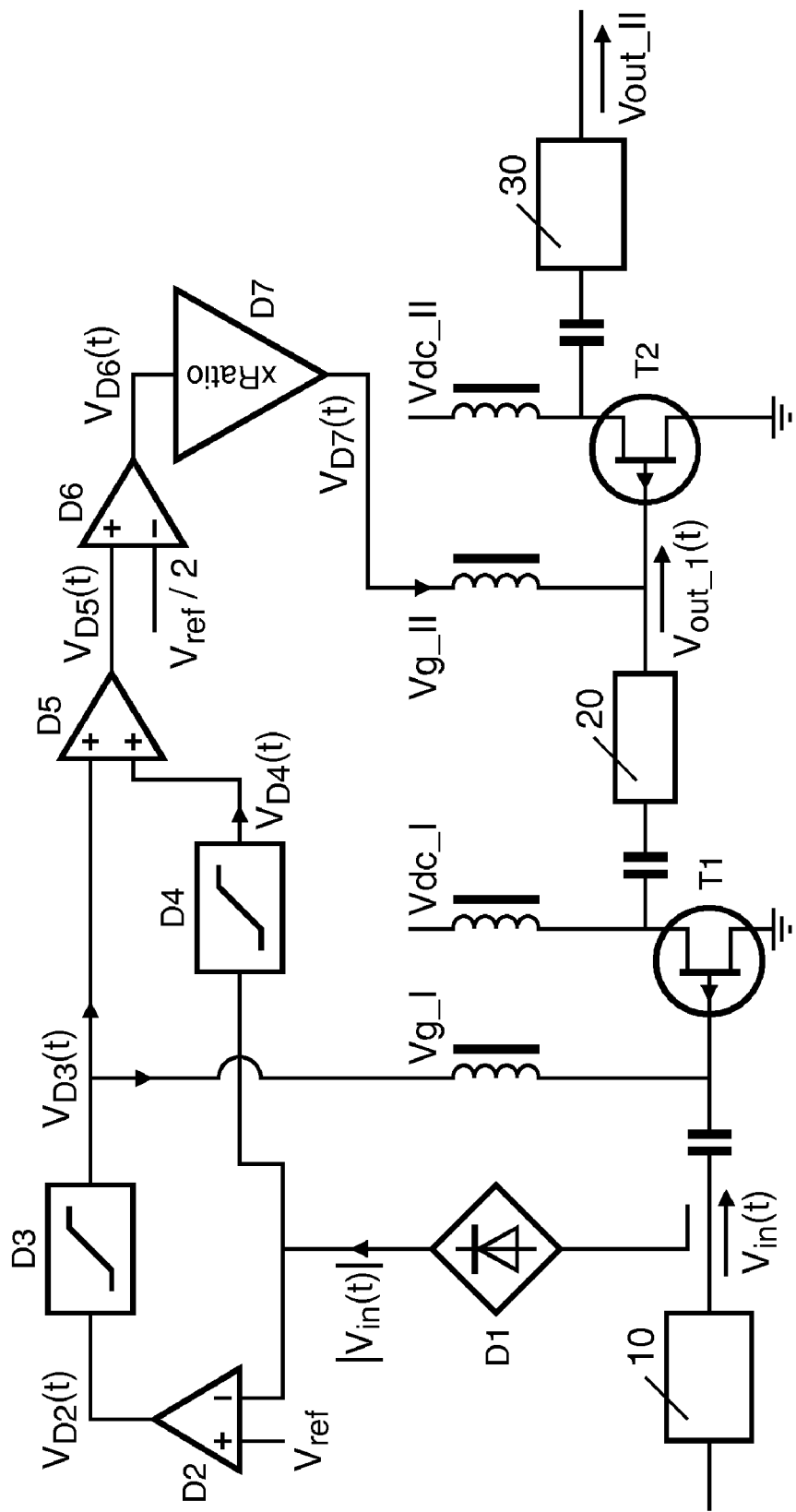
FIG. 4 depicts a more detailed version of the main amplifier of the Doherty amplifier, according to an embodiment of the invention.

FIG. 4 depicts a more detailed implementation of the first amplifier, according to an embodiment of the invention.

In FIG. 4 the control logic circuit comprising a first difference amplifier D2 adapted to receive an output signal generated by the envelope detector and a first reference signal and generating a first difference signal. A first limiter D3 adapted to receive the first difference signal and generates a first limiter output signal. The control logic circuit further comprises a second limiter D4 adapted to receive the output signal generated by the envelope detector and to generate a second limiter output signal. The control logic circuit further comprises a summing amplifier D5, adapted to receive the outputs of the first and second limiters, and a subtracting amplifier D6 adapted to receive the output of D5 and the second reference signal. The first limiter output signal is adapted to control the first gate.

The second control gate receives the subtracting output signal of D6 via an amplifier D7. The second reference signal is simply half of the first reference signal.

We denote the input signal of the driving PA to be $V_{in}(t)$. Its envelope $|V_{in}(t)|\cdot|V_{in}(t)|$ is obtained through an envelope detector D1 and fed into a first difference amplifier D2 and a first amplitude limiter D4. The output of D2, $V_{D2}(t)$, is given by the equation (1), where $E_{peak\_1}=\max(|V_{in}(t)|)$ is a predetermined constant equal to the maximum allowable envelope of $V_{in}(t)$.

$$V_{D2}(t)=V_{ref}-|V_{in}(t)|=E_{peak\_1}-|V_{in}(t)| \quad (1)$$

The functionality of both the limiter D3 and D4 is to allow a direct pass-through of their input signals if their amplitudes are less than $$\frac{E_{peak\_1}}{2},$$

and to output $$\frac{E_{peak\_1}}{2},$$

otherwise. The output of D3, $V_{D3}(t)$, is given by the equation (2)

$$V_{D3}(t) = \begin{cases} E_{peak\_I}/2 & |V_{in}(t)| < E_{peak\_I}/2 \\ E_{peak\_I} - |V_{in}(t)| & E_{peak\_I}/2 \le |V_{in}(t)| < E_{peak\_I} \end{cases} \quad (2)$$

Because the inputs of D3 and D4 will never be negative, so will also be their outputs. The output of the adder D5 is then given by the equation (3).

$$V_{D5}(t) = \begin{cases} \dfrac{E_{peak\_I}}{2} + |V_{in}(t)| & 0 \le |V_{in}(t)| \le \dfrac{E_{peak\_I}}{2} \\ \dfrac{3E_{peak\_I}}{2} - |V_{in}(t)| & E_{peak\_I} \ge |V_{in}(t)| > \dfrac{E_{peak\_I}}{2} \end{cases} \quad (3)$$

The output of the second difference amplifier D6 is given by the equation (4).

$$V_{D6}(t) = \begin{cases} |V_{in}(t)| & 0 \le |V_{in}(t)| \le \dfrac{E_{peak\_I}}{2} \\ E_{peak\_I} - |V_{in}(t)| & E_{peak\_I} \ge |V_{in}(t)| > \dfrac{E_{peak\_I}}{2} \end{cases} \quad (4)$$

Finally, the output of the amplifier D7, an amplifier whose gain is $$-0.8 \frac{E_{peak\_II}}{E_{peak\_I}},$$

given by the equation (5), where $E_{peak\_II} = \max(|V_{out\_I}(t)|)$ is pre-determined and equal to the maximum envelope of $V_{out\_I}(t)$, the input signal of the output PA.

$$V_{D7}(t) = \begin{cases} -0.8 E_{peak\_II} * \dfrac{|V_{in}(t)|}{E_{peak\_I}} & 0 \le |V_{in}(t)| \le \dfrac{E_{peak\_I}}{2} \\ -0.8 E_{peak\_II} * \left(1 - \dfrac{|V_{in}(t)|}{E_{peak\_I}}\right) & E_{peak\_I} \ge |V_{in}(t)| > \dfrac{E_{peak\_I}}{2} \end{cases} \quad (5)$$

As it was already mentioned, $E_{peak\_I}$ denotes the maximum envelope of $V_{in}$, and $E_{peak\_II}$ the maximum envelope of Vout_I. The gate biases of the Driver PA and the output PA are Vg_I and Vg_II, respectively. According to the above description, the bias voltages Vg_I and Vg_II are controlled by $|V_{in}(t)|$.

Figure 5:
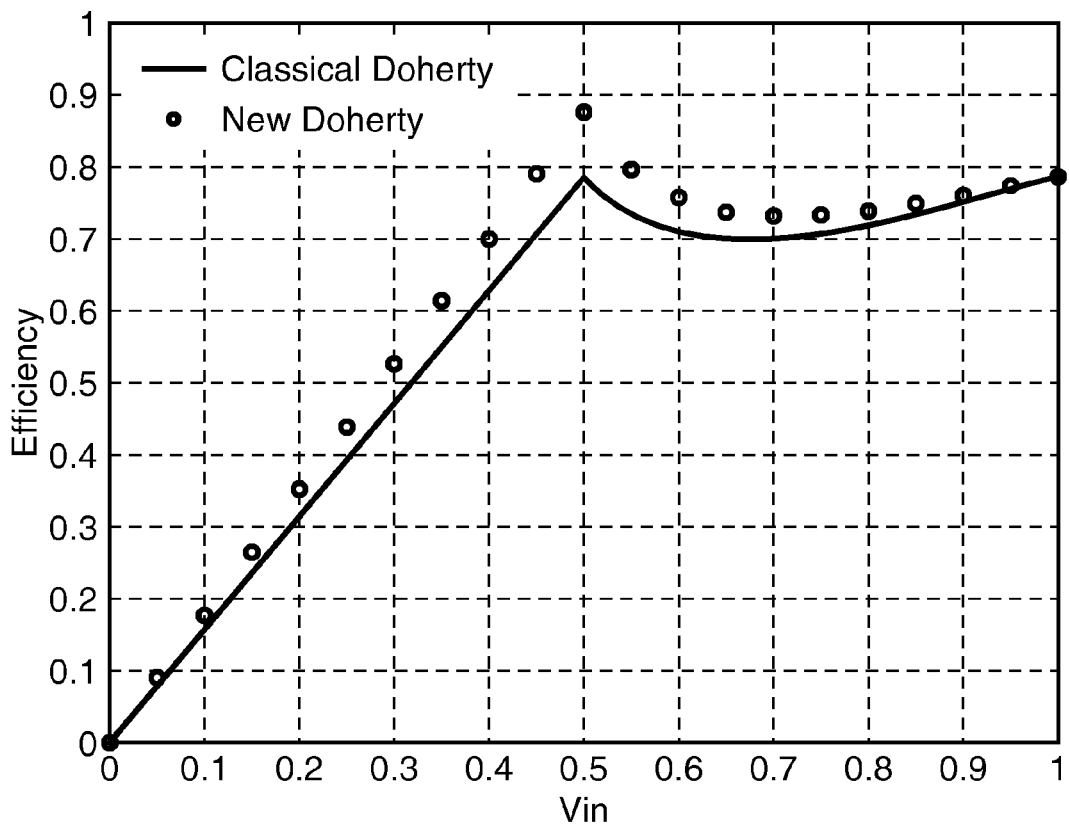
FIG. 5 depicts a efficiency comparison between the known Doherty amplifiers and the Doherty amplifier according to the invention.

FIG. 5 depicts an efficiency comparison between the known Doherty amplifiers and the Doherty amplifier according to the invention. It is easy to observe that the efficiency of the amplifier according to the invention is improved.

Figure 6:
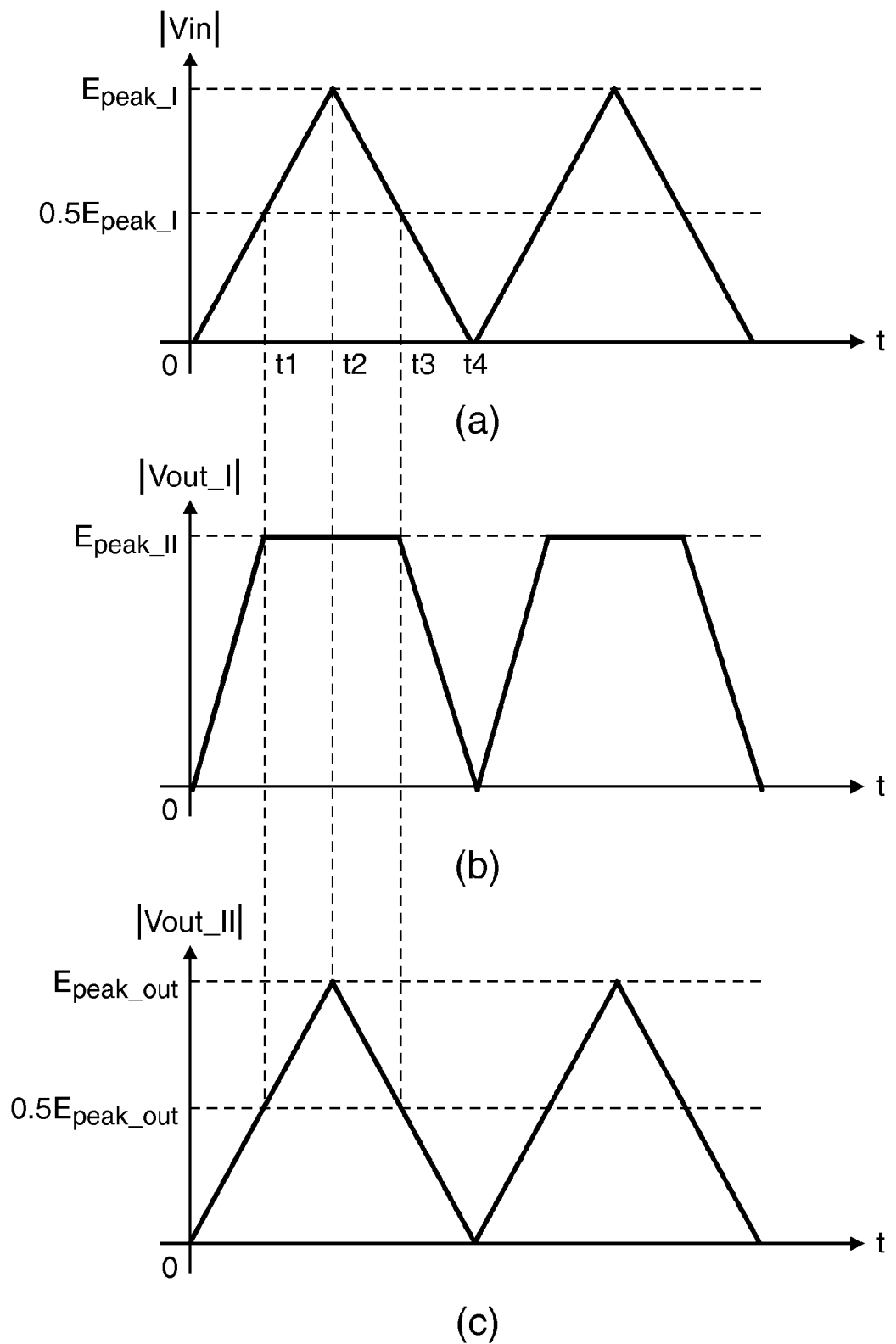
FIG. 6 depicts an example waveform of the Doherty amplifier according to the invention.

FIG. 6 depicts one example of the waveforms of the Doherty amplifier according to the invention. It is easy to see that when $|V_{in}|=E_{peak\_I}$, both the Driver PA and the output PA work in class B because Vg_I=Vg_II=0. The drain bias Vdc_II and the load impedance of the output PA are so set that when $|Vin|=E_{peak\_I}$ the efficiency reaches its maximum possible for a class B amplifier, i.e., 78.5% in this case.

FIG. 6(b) shows the corresponding Driver PA output envelope |Vout_I| and FIG. 6(c) |Vout_II|, the output envelope of the output PA. Table I summarizes the key facts of the working conditions of the Driver PA and output PA in this situation, where the relative gain is the gain relative to the theoretical gain of the device in class B.

TABLE I

Key facts summary corresponding to FIG. 6

| | | Status DPA | | | Status output PA | |
|---|---|---|---|---|---|---|
| time | Vg_I | Conduction angle | Relative Gain | Vg_II | Conduction Angle | Relative Gain |
| 0~t1 | $0.5E_{peak\_I}$ | $2\pi$ | 2 | $0 \to -0.4E_{peak\_II}$ | $0.73\pi$ | 0.5 |
| t1~t2 | $0.5E_{peak\_I} \to 0$ | $2\pi \to \pi$ | $2 \to 1$ | $-0.4E_{peak\_II} \to 0$ | $0.73\pi \to \pi$ | $0.5 \to 1$ |
| t2~t3 | $0 \to 0.5E_{peak\_I}$ | $\pi \to 2\pi$ | $1 \to 2$ | $0 \to -0.4E_{peak\_II}$ | $\pi \to 0.73\pi$ | $1 \to 0.5$ |
| t3~t4 | $0.5E_{peak\_I}$ | $2\pi$ | $2 \to 1$ | $-0.4E_{peak\_II} \to 0$ | $0.73\pi$ | 0.5 |

In the following it is presented a quantitative analysis given here to demonstrate the efficiency and the linearity of the two-stage PA according to the invention.

Specifically, we analyze five situations when $|V_{in}|=0.25E_{peak\_I}$, $0.5E_{peak\_I}$, $0.6E_{peak\_I}$, $0.7E_{peak\_I}$ and $0.9E_{peak\_I}$, in addition to the situations when $|V_{in}|=0$ and when $|V_{in}|=E_{peak\_I}$.

When $|V_{in}|=0$, Vg_I=$0.5E_{peak\_I}$ and Vg_II=0. The output PA consumes no DC power because there is no DC current.

For $|V_{in}|=0.25E_{peak\_I}$:
1) Vg_I=$0.5E_{peak\_I}$ and Vg_II=$-0.8E_{peak\_II}*0.25=-0.2E_{peak\_II}$.
2) The Driver PA is working in class A and has the relative gain of 2, |Vout_I|=$0.5E_{peak\_II}$.
3) For |Vout_I|=$0.5E_{peak\_II}$ and Vg_II=$-0.2E_{peak\_II}$, the output PA works at a conduction angle of $0.73\pi$. As a result, one gets $I_1=0.250I_m$ and $I_{dc}=0.143I_m$, where $I_1$ is the fundamental current, $I_{dc}$ the DC current and $I_m$ corresponds to $I_1$ when |Vout_I|=$E_{peak\_II}$ & Vg_II=0.

Based on the specific $I_1$ and $I_{dc}$, one obtains, $$\eta_I = 21.9\%, \eta_D = 43.7\% \ (\eta = 39.3\%)$$

where $\eta_I$ denotes the efficiency when the two-stage PA is used independently, $\eta_D$ the efficiency of the Doherty PA with the two-stage PA used as the main PA, $\eta$ the efficiency of the classical Doherty PA.

For $|V_{in}|=0.5E_{peak\_I}$:
1) Vg_I=$0.5E_{peak\_I}$ and Vg_II=$-0.4E_{peak\_II}$.
2) The Driver PA is working in class A and has the relative gain of 2, |Vout_I|=$E_{peak\_II}$.
3) For |Vout_I|=$E_{peak\_II}$ and Vg_II=$-0.4E_{peak\_II}$, the conduction angle of the output PA remains to be $0.73\pi$. As a result, one gets $I_1=0.501I_m$ and $I_{dc}=0.285I_m$. In turn, $$\eta_I = 43.9\%, \eta_D = 87.8\% \ (\eta = 78.5\%)$$

For $|V_{in}|=0.6E_{peak\_I}$:
1) $Vg\_I=0.4E_{peak\_I}$ and $Vg\_II=-0.32E_{peak\_II}$.
2) The Driver PA is working in class AB with the saturated output, $|Vout\_I|=E_{peak\_II}$.
3) For $|Vout\_I|=E_{peak\_II}$ and $Vg\_II=-0.32E_{peak\_II}$, the conduction angle of the output PA becomes $0.784\pi$. As a result, one gets $I_1=0.596I_m$ and $I_{dc}=0.345I_m$. In turn, $\eta_I=51.7\%$, $\eta_D=75.7\%$ ($\eta=70.7\%$)

For $|V_{in}|=0.7E_{peak\_I}$:
1) $Vg\_I=0.3E_{peak\_I}$ and $Vg\_II=-0.24E_{peak\_II}$.
2) The Driver PA is working in class AB with the saturated output, $|Vout\_I|=E_{peak\_II}$.
3) For $|Vout\_I|=E_{peak\_II}$ and $Vg\_II=-0.24E_{peak\_II}$, the conduction angle of the output PA becomes $0.84\pi$. As a result, one gets $I_1=0.695I_m$ and $I_{dc}=0.345I_m$. In turn, $\eta_I=59.1\%$, $\eta_D=73.2\%$ ($\eta=70.0\%$)

For $|V_{in}|=0.9E_{peak\_I}$:
1) $Vg\_I=0.1E_{peak\_I}$ and $Vg\_II=-0.08E_{peak\_II}$.
2) The Driver PA is working in class AB with the saturated output, $|Vout\_I|=E_{peak\_II}$.
3) For $|Vout\_I|=E_{peak\_II}$ and $Vg\_II=-0.08E_{peak\_II}$, the conduction angle of the output PA becomes $0.94\pi$. As a result, one gets $I_1=0.894I_m$ and $I_{dc}=0.554I_m$. In turn, $\eta_I=72.6\%$, $\eta_D=75.9\%$ ($\eta=74.8\%$)

For $|V_{in}|=E_{peak\_I}$:
1) $Vg\_I=0$ and $Vg\_II=0$.
2) The Driver PA is working in class B, $|Vout\_I|=E_{peak\_II}$.
3) For $|Vout\_I|=E_{peak\_II}$ and $Vg\_II=0$, the output PA works in class B, $I_1=I_m$ and $I_{dc}=0.637I_m$. In turn, $\eta_I=\eta_D=78.5\%$ ($\eta=78.5\%$)

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A Doherty power amplifier comprising:
   a first power amplifier adapted to receive an input signal and adapted to provide a first output signal which is phase shifted with respect to the input signal;
   a second power amplifier, adapted to receive a phase shifted input signal and adapted to provide a second output signal;
   characterized in that at least one of the first or the second power amplifiers comprises a first driver power amplifier comprising a first gate input and a first drain output;
   the first driver power amplifier being coupled to a first output power amplifier comprising a second gate input and a second drain output;
   the first gate input and the second gate input being adapted to receive a control signal, the control signal being obtained after an envelope detection provided by an envelope detector coupled to the input signal; and
   a control logic circuit configured and arranged to provide first and second limiter output signals in response to the envelope detection for controlling the first and second gate inputs, respectively, depending on respective amplitudes of the first and second limiter output signals.

2. A Doherty power amplifier as claimed claim 1, wherein a signal generated by either the first power amplifier or the second power amplifier or both is inputted in a circuit for trapping a second harmonic or a third harmonic of the signal.

3. A Doherty power amplifier comprising:
   a first power amplifier adapted to receive an input signal and adapted to provide a first output signal which is phase shifted with respect to the input signal;
   a second power amplifier, adapted to receive a phase shifted input signal and adapted to provide a second output signal;
   characterized in that at least one of the first or the second power amplifiers comprises a first driver power amplifier comprising a first gate input and a first drain output;
   the first driver power amplifier being coupled to a first output power amplifier comprising a second gate input and a second drain output;
   the first gate input and the second gate input being adapted to receive a control signal, the control signal being obtained after an envelope detection provided by an envelope detector coupled to the input signal; and
   a control logic circuit having
      a first difference amplifier adapted to receive an output signal generated by the envelope detector and a first reference signal and generating a first difference signal;
      a first limiter adapted to receive the first difference signal and generating a first limiter output signal;
      a second limiter adapted to receive the output signal generated by the envelope detector and to generate a second limiter output signal; and
      a summing amplifier adapted to receive the second limiter output signal and the first difference signal, the summing amplifier generating a summing output signal, wherein the first limiter output signal is adapted to control the first gate and the summing output signal is adapted to control the second gate.

4. A Doherty power amplifier as claimed in claim 3, wherein the second control gate is configured and arranged for receiving the summing output signal via an amplifier.

5. A Doherty power amplifier as claimed in claim 3, wherein the summing amplifier comprises an adder configured and arranged to receive the second limiter output signal and the first difference signal and to generate an adder output signal, the summing amplifier further comprising a second difference amplifier for receiving the adder output signal and a second reference signal and generating the summing output signal.

6. A Doherty power amplifier as claimed in claim 5, wherein the second reference signal is substantially half of the first reference signal.

7. A Doherty power amplifier comprising:
   a first power amplifier adapted to receive an input signal and adapted to provide a first output signal which is phase shifted with respect the input signal;
   a second power amplifier, adapted to receive a phase shifted input signal and adapted to provide a second output signal;
   characterized in that each one of the first and the second power amplifiers comprises a first driver power amplifier comprising a first gate input and a first drain output;
   the first driver power amplifier being coupled to a first output power amplifier comprising a second gate input and a second drain output;

the first gate input and the second gate input being adapted to receive a control signal, the control signal being obtained after an envelope detection provided by an envelope detector coupled to the input signal; and a control logic circuit configured and arranged to provide first and second limiter output signals in response to the envelope detection for controlling the first and second gate inputs, respectively, depending on respective amplitudes of the first and second limiter output signals.

8. A method of operating a Doherty power amplifier comprising steps of:

receiving an input signal by a first power amplifier and providing a first output signal which is phase shifted with respect to the input signal;

receiving a phase shifted input signal by a second power amplifier, and providing a second output signal;

characterized in that the method further comprises steps of receiving a control signal representing a signal that would be obtained by an envelope detection of the input signal;

applying the control signal to a circuit comprising a first driver power amplifier comprising a first gate input and a first drain output, the first driver power amplifier being coupled to a first output power amplifier comprising a second gate input and a second drain output, the first gate input and the second gate input being adapted to receive a control signal, the control signal being obtained after an envelope detection provided by an envelope detector coupled to the input signal; and providing first and second limiter output signals in response to the envelope detection for controlling the first and second gate inputs, respectively, depending on respective amplitudes of the first and second limiter output signals.

9. A method of operating a Doherty power amplifier according to claim 8, further comprising the step of envelope detection of the input signal using an envelope detector, for obtaining the control signal.

\* \* \* \* \*